United States Patent
Chang et al.

(10) Patent No.: US 6,169,322 B1
(45) Date of Patent: *Jan. 2, 2001

(54) DIE ATTACH PAD ADAPTED TO REDUCE DELAMINATION STRESS AND METHOD OF USING SAME

(75) Inventors: Bo S. Chang, Cupertino; Fritz W. Beyerlein, Sunnyvale, both of CA (US)

(73) Assignee: Cypress Semiconductor Corporation, San Jose, CA (US)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 09/036,598

(22) Filed: Mar. 6, 1998

(51) Int. Cl.$^7$ .................................................. H01L 23/495
(52) U.S. Cl. ........................ 257/663; 257/666; 257/670; 257/676; 257/655; 257/784; 438/123; 361/813
(58) Field of Search ................................. 257/666, 669, 257/676, 670, 650, 784, 783, 635; 438/118, 123; 361/813

(56) References Cited

U.S. PATENT DOCUMENTS

| | | | |
|---|---|---|---|
| 4,857,989 | * 8/1989 | Mori et al. | 257/666 |
| 4,942,452 | * 7/1990 | Kitano et al. | 357/68 |
| 5,378,656 | * 1/1995 | Kajihara et al. | 29/827 |

FOREIGN PATENT DOCUMENTS

| | | | |
|---|---|---|---|
| 405218275 | * 8/1993 | (JP) | . |
| 408008388 | * 1/1996 | (JP) | . |

OTHER PUBLICATIONS

Plan views of leadframes made by Sony, Hitachi, NEC, Motorola and Toshiba, believed to be publicly available in Dec. 1996.

Plan views of leadframes made by Micron Technology, believed to be publicly available in Dec. 1996.

* cited by examiner

Primary Examiner—Tom Thomas
Assistant Examiner—Luan Thai
(74) Attorney, Agent, or Firm—David R. Graham (57) ABSTRACT

The invention enables a die to be attached to a die attach pad so as to reduce delamination stress that can arise when the die and die attach pad are heated, and so as to provide support for the die at locations where bond pads are formed so that the die is not damaged by forces applied to the die during attachment of bond wires to the bond pads. The die and die attach pad so attached can be used to produce a packaged die having improved delamination characteristics, so that the cost to manufacture and/or store the packaged die can be reduced. The invention further provides die attach pads and leadframes including such die attach pads that are particularly suited to achieving the aforementioned functional characteristics.

22 Claims, 9 Drawing Sheets

DIE ATTACH PAD ADAPTED TO REDUCE DELAMINATION STRESS AND METHOD OF USING SAME

BACKGROUND OF THE INVENTION

1. Field of the Invention

This invention relates to the packaging of a die or dice (e.g., a semiconductor die or dice), including the methods used to form packaged die or dice, the packaged die or dice, and structures including packaged die or dice. In particular, the invention relates to die attach pads adapted to enable reduction of delamination stress, to methods for attaching a die or dice to such die attach pads, and to packaged die or dice including such die attach pads.

2. Related Art

Figure 1A:
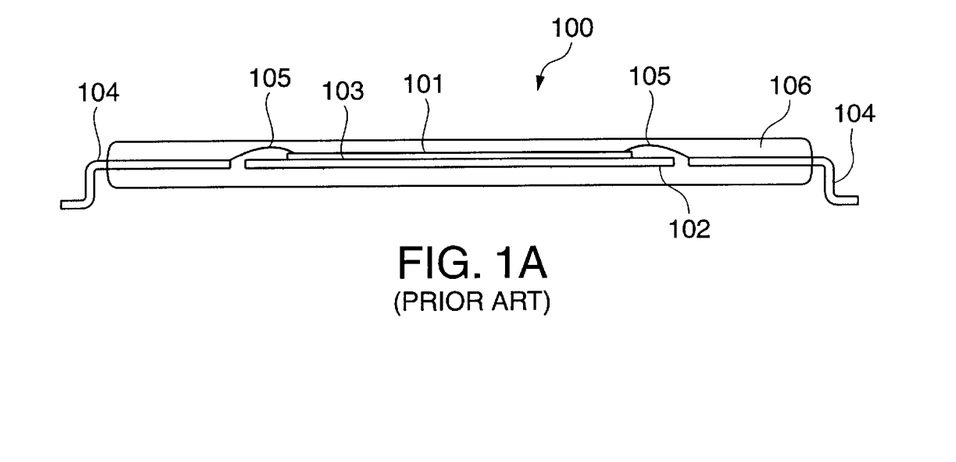
FIG. 1A is a cross-sectional side view (viewed in the direction of the sectional line 1A—1A of FIG. 1B) of a conventional packaged die.

FIG. 1A is a cross-sectional side view (viewed in the direction of the sectional line 1A—1A of FIG. 1B) of a conventional packaged die 100. A surface ("die attachment surface") of a die 101 is attached to a surface ("die attach pad attachment surface") of a die attach pad 102 with a die attach material 103. In the packaged die 100, the entire die attachment surface of the die 101 is attached with the die attach material 103 to the die attach pad attachment surface of the die attach pad 102 (as illustrated more clearly in FIG. 1B). Bond pads (designated singly or collectively by the numeral 107; see FIG. 1B) are formed on a surface of the die 101 opposite the die attachment surface. Each of a set of bond wires 105 are attached to, and extend between, a bond pad 107 on the die 101 and a portion of a corresponding one of a set of leads 104 formed proximate to the die 101. The die 101, die attach pad 102, die attach material 103, bond wires 105 and an inner portion of the leads 104 are encapsulated by an encapsulant 106.

Figure 1B:
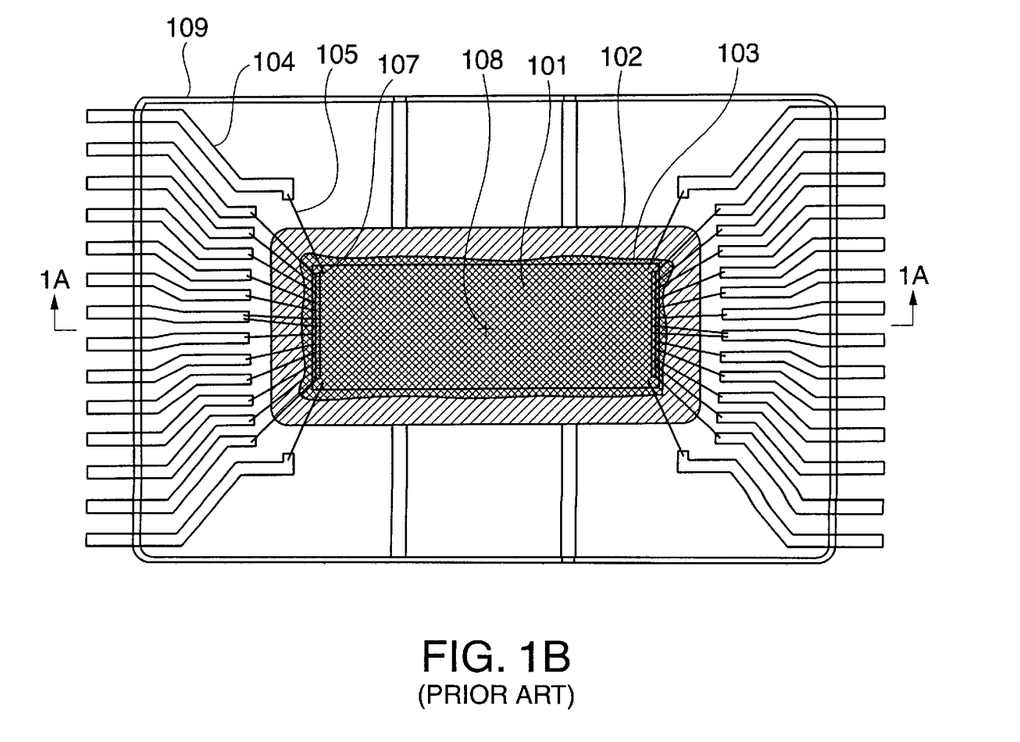
FIG. 1B is a plan view of the die, die attach pad, die attach material, leads and bond wires of the packaged die of FIG. 1A.

FIG. 1B is a plan view of the die 101, die attach pad 102, die attach material 103, leads 104 and bond wires 105 of the packaged die 100 prior to encapsulation in the encapsulant 106. As shown in FIG. 1B, the die attach pad 102 and the leads 104 are connected by a frame 109 to form an integral structure ("leadframe") that facilitates the manufacture and assembly of the packaged die 100, as known to those skilled in the art.

During manufacture of the packaged die 100, the packaged die 100 can be subjected to heat. For example, the packaged die 100 can be attached to a printed circuit board by soldering to the printed circuit board the portions of the leads 105 that extend from the packaged die 100. Such soldering can take place in a chamber that can be heated to temperatures of, for example, 220° C. Additionally, operation of the circuitry formed on the die 101 can also generate heat, causing the temperature of the packaged die 100 to increase.

Heating of the packaged die 100 can produce forces that cause stress in the die attach material 103 ("die attach stress"), as explained in more detail below. If the die attach stress becomes great enough, the bond between the die 101 and the die attach pad 102 can be broken. Breaking of the attachment between the die 101 and die attach pad 102 can ultimately cause or contribute to delamination (separation) of the encapsulant 106 from other parts of the packaged die, such as the die 101 or die attach pad 102. Delamination can render a packaged die immediately non-operational (by, for example, causing one or more bond wires to become detached from either a bond pad or a lead) or can break the encapsulant seal so that contaminants can enter the packaged die, eventually causing the packaged die to become non-operational.

One type of die attach stress (sometimes referred to hereinafter as "differential CTE stress") that can be produced by heating a packaged die arises from forces produced by differential thermal expansion of the die 101 and die attach pad 102, which are typically made of different materials (e.g., silicon for the die 101 and copper for the die attach pad 102) that have different coefficients of thermal expansion (CTEs). The die 101 is typically concentrically mounted with respect to the die attach pad 102, as viewed in the direction of FIG. 1B. At the center (designated by the numeral 108 in FIG. 1B) of the die 101 and die attach pad 102 there is little or no expansion of the die 101 and die attach pad 102 so that there is little or no differential CTE stress in the die attach material. As the distance from the center 108 increases, the expansion of the die 101 and die attach pad 102—and, in particular, the difference in expansion of the die 101 and die attach pad 102—increases. Thus, the differential CTE stress in the die attach material increases as the distance from the center 108 increases.

Another type of die attach stress (sometimes referred to hereinafter as "moisture expansion stress") that can be produced by heating a packaged die arises from forces produced by the expansion of steam formed from water present within the die attach material 103. The encapsulant 106 is typically made of a porous material that allows water to enter the packaged die 100. When the packaged die 100 is heated to a sufficiently high temperature, water in the packaged die 100 becomes steam. Over time, the steam can escape from the packaged die 100 through the encapsulant 106. However, steam formed from water collected in the die attach material 103 cannot easily escape the packaged die 100, both because the steam must travel a relatively long path to exit the encapsulant 106 (especially when located at the center 108) and because the materials (e.g., silicon of which the die 101 is typically comprised and copper of which the die attach pad 102 is often made) that are proximate to and/or the materials (e.g., silver) that are part of the die attach material 103 are relatively unporous as compared to the material (e.g., epoxy resin) of which the encapsulant 106 is typically comprised. The moisture expansion stress can be approximately constant at all positions relative to the center 108 or the moisture expansion stress may decrease slightly as the distance from the center 108 increases (due to the longer path that the steam must travel to exit the packaged die 100).

Figure 2:
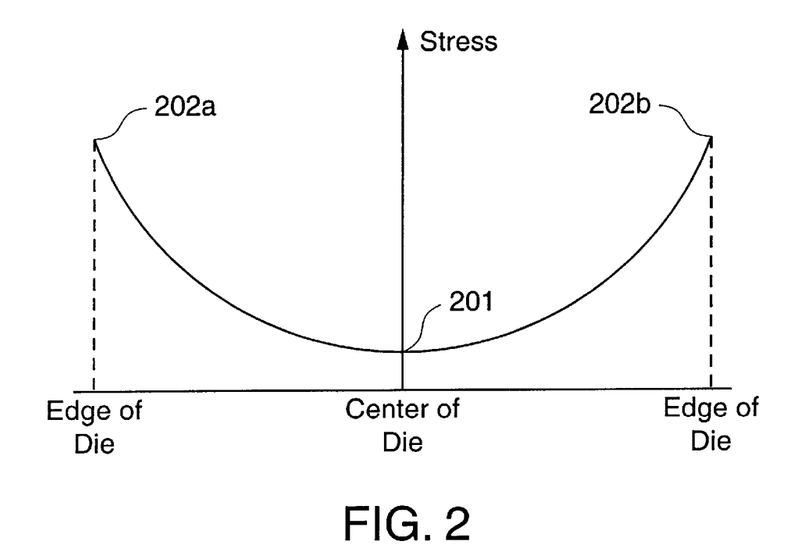
FIG. 2 is a graph illustrating a typical relationship of die attach stress to position along a line (in the plane of FIG. 1B) extending through the center of a die mounted concentrically on a die attach pad.

FIG. 2 is a graph illustrating a typical relationship of die attach stress to position along a line (in the plane of FIG. 1B) extending through the center of a die mounted concentrically on a die attach pad. As can be seen, the die attach stress has a minimum (though typically non-zero, due to the moisture expansion stress) magnitude near the center of the die, indicated by the numeral 201 in FIG. 2. The die attach stress increases as the distance from the center of the die increases, due to the differential CTE stress: in general, the die attach stress in any direction from the center of the die is at a maximum at the edge of the die, indicated by the numerals 202a and 202b in FIG. 2.

Heating of the packaged die 100 can also produce forces that cause stress in the encapsulant 106 ("encapsulant stress") where the encapsulant 106 is attached to other parts of the packaged die 100. (Together, the encapsulant stress and die attach stress are referred to herein as "delamination stress.") In particular, since the encapsulant 106 and die attach pad 102 are made of different materials (e.g., epoxy resin for the encapsulant 106 and copper for the die attach pad 102) that have different CTEs, heating the packaged die 100 can produce differential CTE stress in the part of the encapsulant 106 attached to the die attach pad 102. If this differential CTE stress in the encapsulant 106 becomes great enough, the bond between the encapsulant 106 and the die attach pad 102 can be broken, i.e., the encapsulant 106 can delaminate from the die attach pad 102. Such delamination, either alone or together with delamination of the encapsulant 106 from other parts of the packaged die 100, can cause the packaged die to become non-operational as described above.

At the center 108 of the die attach pad 102 there is little or no expansion of the encapsulant 106 and die attach pad 102 so that there is little or no differential CTE stress in the encapsulant 106. As the distance from the center 108 increases, the expansion of the encapsulant 106 and die attach pad 102—and, in particular, the difference in expansion of the encapsulant 106 and die attach pad 102—increases. Thus, typically, the differential CTE stress in the encapsulant 106 increases as the distance from the center 108 increases.

If the die attach stress and/or the encapsulant stress become great enough, delamination of the encapsulant 106 from other parts of the packaged die 100 can result. Both the die attach stress and the encapsulant stress can be reduced by removing material from the die attach area of the die attach pad 102. (The "die attach area" refers to the section of a die attach pad, or the area on the attachment surface of the die attach pad, defined by the periphery of a die when the die is attached to the die attach pad.) Removal of material from the die attach area of the die attach pad causes less than the entire die attachment surface of the die 101 to be attached to the die attach pad 102 with the die attach material 103. This reduces die attach stress by reducing the amount of die attach material 103 used, so that less moisture accumulates in the die attach material 103, thereby reducing moisture expansion stress. Additionally, where there is no attachment between the die 101 and the die attach pad 102, there is no die attach material 103 in which differential CTE stress can occur. Similarly, removal of material from the die attach area of the die attach pad results in less attachment between the encapsulant 106 and the die attach pad 102; where there is no attachment between the encapsulant 106 and the die attach pad 102, no differential CTE stress can occur in the encapsulant 106 as a result of differential thermal expansion of the encapsulant 106 and die attach pad 102.

In particular, the die attach stress can be reduced by removing material from a die attach pad near the periphery of the die attach area, since, as shown in FIG. 2, this is where the die attach stress is greatest. This can also significantly reduce encapsulant stress, since material is removed from the die attach pad relatively far from the center of the die attach pad. However, it may be infeasible or undesirable to remove material from the die attach pad adjacent regions on the die attachment surface of the die opposite the location of bond pads on the opposite surface of the die—which regions are typically near the periphery of the die attach area—since the presence of die attach pad material at such regions may be necessary or desirable to provide support for the die during the process of attaching the bond wires to the bond pads.

Figure 3A:
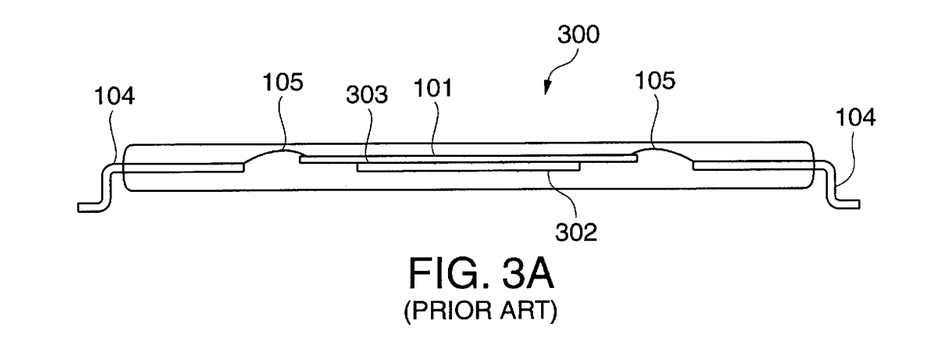
FIG. 3A is a cross-sectional side view of a packaged die including a die attach pad which has been formed by removing material from the periphery of the die attach area of the die attach pad of FIGS. 1A and 1B.
Figure 3B:
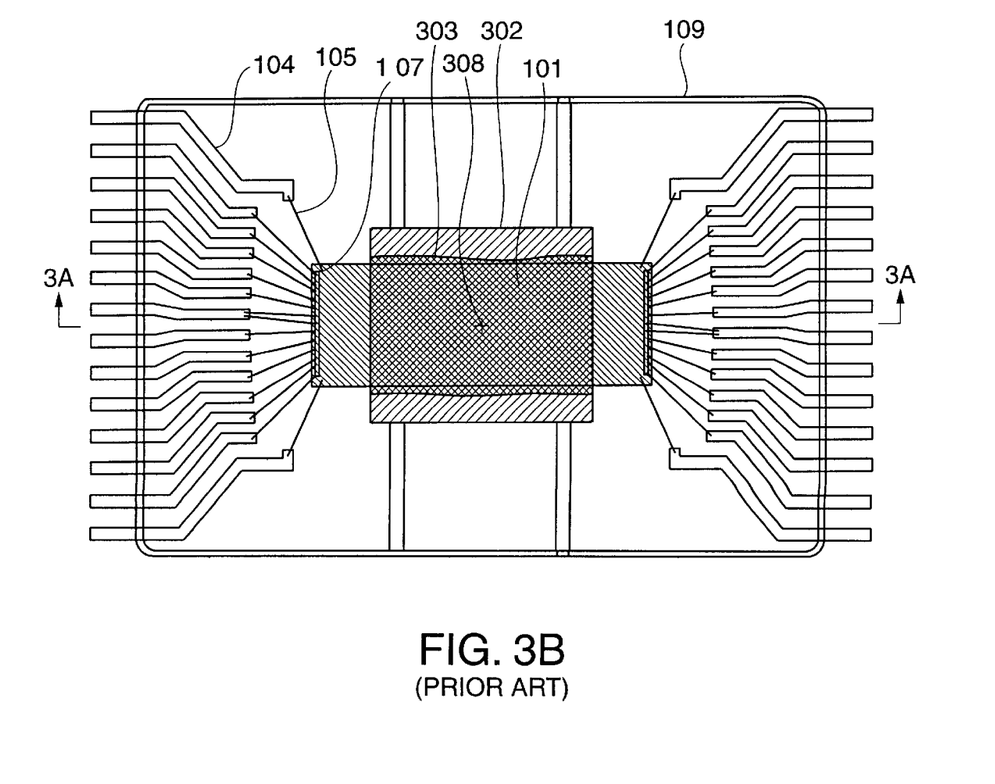
FIG. 3B is a plan view of the die, die attach pad, die attach material, leads and bond wires of the packaged die of FIG. 3A.

FIG. 3A is a cross-sectional side view of a packaged die 300 including a die attach pad 302 which has been formed by removing material from the periphery of the die attach area of the die attach pad 102 of FIGS. 1A and 1B. FIG. 3B is a plan view of the die 101, die attach pad 302, die attach material 303, leads 104 and bond wires 105 of the packaged die 300. In the packaged die 300, material has been removed from the die attach pad 302 at locations that are farthest from the center 308 of the die attach pad 302, so as to eliminate portions of the die attach material 303 which would otherwise experience the greatest die attach stress (and significant encapsulant stress) during heating of the packaged die 300. However, these locations are also adjacent regions on the die attachment surface of the die 101 opposite the locations of bond pads 107 on the opposite surface of the die 101. During the process of attaching a bond wire 105 to a bond pad 107, a force is typically applied (in the downward direction in FIG. 3A) by a wirebonding tool to the die 101 at the location of the bond pad 107. Since the material at the periphery of the die attach area of the die attach pad 302 has been removed, the die 101 is unsupported during attachment of the bond wires 105 to the bond pads 107. As a result, the downward force that is applied during such attachment may break or otherwise damage the die 101. Thus, notwithstanding the reduction in delamination stress, a packaged die including a die attach pad as in FIGS. 3A and 3B may not be desirable.

It may be possible to mitigate the potential for damage to an unsupported die (such as the die 101 shown in FIG. 3) during attachment of bond wires to the bond pads by using special wirebonding techniques that apply relatively little downward force to the die. However, such techniques are likely to add significantly to the cost of producing a packaged die and may not be suitable for use in mass-production of packaged die.

Figure 4A:
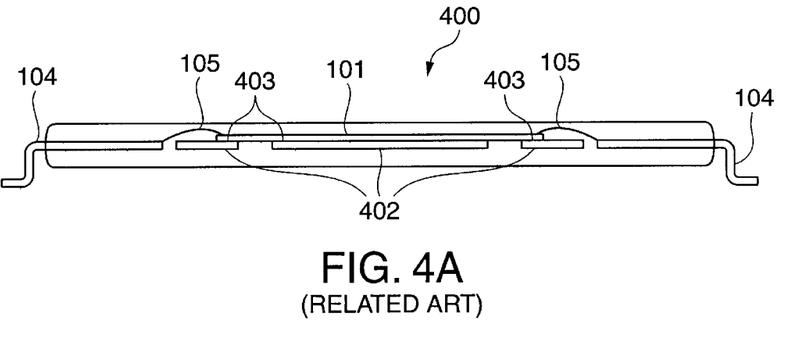
FIG. 4A is a cross-sectional side view of a packaged die including a die attach pad which has been formed by removing material from the die attach area of the die attach pad of FIGS. 1A and 1B not at the periphery of the die attach area, but, rather, closer to the center of the die.
Figure 4B:
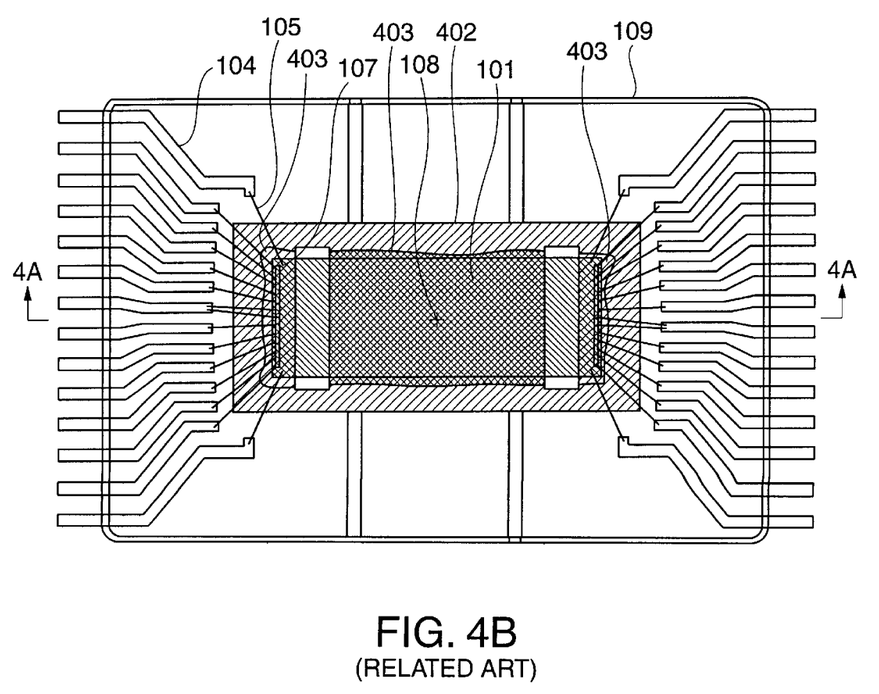
FIG. 4B is a plan view of the die, die attach pad, die attach material, leads and bond wires of the packaged die of FIG. 4A.

FIG. 4A is a cross-sectional side view of a packaged die 400 including a die attach pad 402 which has also been formed by removing material from the die attach area of the die attach pad 102 of FIGS. 1A and 1B. FIG. 4B is a plan view of the die 101, die attach pad 402, die attach material 403, leads 104 and bond wires 105 of the packaged die 400. In the die attach pad 402, material has been not been removed from the region at which support is provided for the die 101 during the bond wire attachment process, but, instead, at a region further from the periphery of the die attach area and closer to the center 108 of the die. Thus, the problem discussed above with respect to the packaged die 300 of FIGS. 3A and 3B is avoided. However, though the removal of material from the die attach pad 402 reduces the delamination stress during heating of the packaged die 400 as compared to the delamination stress during heating of the packaged die 100 (FIGS. 1A and 1B), the delamination stress is not reduced as much as is the delamination stress in the packaged die 300 (FIGS. 3A and 3B) during heating.

Figure 5:
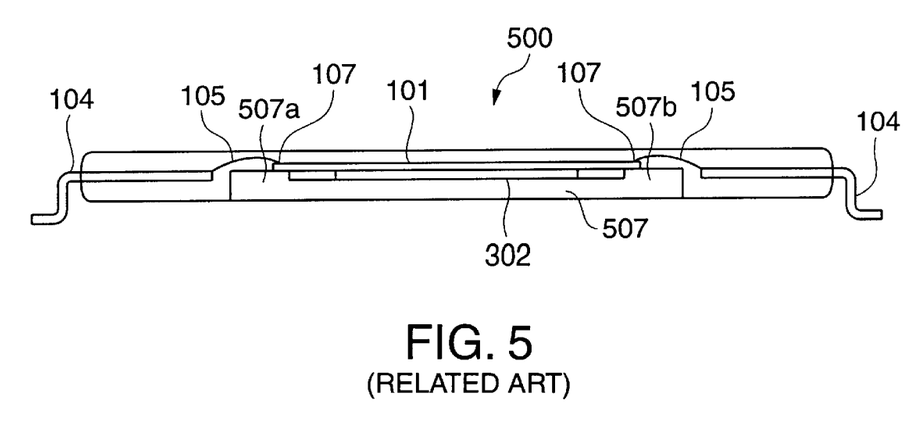
FIG. 5 is a cross-sectional side view of a packaged die including the die attach pad of FIG. 3 and a heater block having raised portions formed to provide support for the die opposite the bond pads formed on the die.

FIG. 5 is a cross-sectional side view of a packaged die 500 including the die attach pad 302 of FIG. 3 and a heater block 507 having raised portions 507a and 507b formed to provide support for the die 101 at the location of the die attachment surface at which such support is needed during the bond wire attachment process. (A heater block can be added to a packaged die, including any of the packaged dies 100, 300, 400 or 500, to provide better heat dissipation from the packaged die than would otherwise be the case.) This enables material to be removed from the periphery of the die attach area of the die attach pad, i.e., the areas of high delamination stress, while still providing support to the die 101 during the attachment of bond wires 105 to the bond pads 107. However, the heater block 507 is more expensive to produce than a standard heater block that does not include the raised portions 507a and 507b and can be more difficult to assemble as part of a packaged die than the standard heater block.

SUMMARY OF THE INVENTION

The invention provides a packaged die in which a die is attached to a die attach pad so as to significantly reduce delamination stress that can arise when the die and die attach pad are heated, and so as to provide support for the die at locations where bond pads are formed so that the die is not damaged by forces applied to the die during attachment of bond wires to bond pads. None of the packaged die described above with respect to FIGS. 1A and 1B, 3A and 3B, 4A and 4B, or 5 provide such dual benefits. The invention further provides die attach pads and leadframes including such die attach pads that are particularly suited to achieving the aforementioned functional characteristics.

In general, a packaged die according to the invention includes: i) a die having a first surface and a second surface opposite the first surface, one or more bond pads being formed on the first surface; and ii) a die attach pad to which the second surface ("die attachment surface") of the die is attached (with, for example, a die attach material such as silver filled epoxy compound). The packaged die can further include one or more leads and one or more bond wires that are used to connect the leads to the bond pads on the die. An encapsulant can be used to encapsulate the die, die attach pad, bond wires and an inner portion of the leads.

In one embodiment of the invention, a die attach pad that can be used with a packaged die according to the invention has a die attach section (i.e., a section of a die attach pad to which a die attach material attaches a die) that is not attached to at least one of the location or locations on the second surface of the die that are farthest from the center of the second surface. The die attach pad also has a bonding support section that, when the die is attached to the die attach pad, is adjacent to a location on the second surface of the die that is opposite the location of the one or more bond pads on the first surface of the die. In a further embodiment, the bonding support section of the die attach pad is not attached to the die.

In another embodiment of the invention, a die attach pad that can be used with a packaged die according to the invention has a die attach section to which the second surface of the die is attached, and a bonding support section that is not attached to the die and that is adjacent to a location on the second surface of the die that is opposite the location of the bond pad on the first surface of the die.

In still another embodiment of the invention, a die attach pad is attached to the die such that less than all of the die attach area of the attachment surface of the die attach pad is attached to the die. In a further embodiment, the die attach pad further includes a bonding support section that is adjacent to a location on the attachment surface of the die that is opposite the location of a bond pad on an opposite surface of the die. In a still further embodiment, the bonding support section is not attached to the die.

The invention reduces delamination stress produced by heating of the die and die attach pad. As discussed above, such delamination stress can include differential CTE stress and moisture expansion stress in the die attach material, and differential CTE stress in the encapsulant. The invention reduces differential CTE stress by eliminating attachment of at least some of the attachment surface of the die to the die attach pad, and some of the die attach pad to the encapsulant. The invention can also reduce moisture expansion stress, since less die attach material is used than would otherwise be the case, thus reducing the material in the die attach region that is susceptible to the collection of moisture (which can expand and produce die attach stress during heating).

To increase the reduction of differential CTE stress in the die attach material, it can be particularly advantageous to eliminate attachment of the die to the die attach pad at a location or locations that are farthest from the center of the attachment surface of the die, since this is where differential CTE stress in the die attach material would otherwise be greatest. For example, it can be desirable to attach the die to the die attach pad so that the attachment surface of the die is not attached to the die attach pad beyond a distance from the center of the attachment surface of the die that is a specified percentage of the distance to the location or locations on the attachment surface of the die that are farthest from the center of the attachment surface. The specified percentage can be, for example, about 25%, about 50% or about 75%, depending upon the size and shape of the die and the particular construction of the die attach pad (as will be more readily apparent from the detailed description of the invention below).

To reduce differential CTE stress in the die attach material, it can also be advantageous to minimize the area of the attachment surface of the die that is attached to the die attach pad. (However, at least a minimum area of the die attachment surface must be attached to ensure adequate attachment of the die to the die attach pad.) For example, it can be desirable to attach the die to the die attach pad so that, in one embodiment, no more than about 60%—and, in additional embodiments, no more than about 54% or no more than about 48%—of the area of the attachment surface of the die is attached to the die attach pad. It can also be desirable to attach the die to the die attach pad so that at least about 6%—and, in additional embodiments, at least about 10% or at least about 14%—of the area of the attachment surface of the die is attached to the die attach pad. In one particular embodiment, the die is attached to the die attach pad so that about 30% of the area of the attachment surface of the die is attached to the die attach pad.

Further, it can also be desirable to control the area of the attachment surface of a die attach section relative to the die attach area of the attachment surface of a die attach pad (in view of considerations such as the effectiveness of heat dissipation by the die attach pad, reduction of die attach stress and encapsulant stress, and flexibility in using the die attach pad to attach dice of different sizes). In one embodiment of the invention, the area of the attachment surface of a die attach section of a die attach pad is no more than about 50%—and, in additional embodiments, no more than about 45% or no more than about 40%—of the die attach area of the attachment surface of the die attach pad. In another embodiment of the invention, the area of the attachment surface of a die attach section of a die attach pad is at least about 5%—and, in additional embodiments, at least about 8% or at least about 11%—of the die attach area of the attachment surface of the die attach pad. In one particular embodiment, the area of the attachment surface of a die attach section of a die attach pad is about 25% of the die attach area of the attachment surface of the die attach pad.

To accomplish reduction of delamination stress as described above, it can be desirable to remove material from a die attach pad to create a defined die attach section. In some cases, it can be desirable to remove material from the die attach pad to create multiple defined die attach sections. The formation of multiple die attach sections may be advantageous, for example, when it is desired to make the area of attachment of the die and die attach pad relatively small, since the multiple die attach sections can help to alleviate any potential problems with balancing the die on the die attach pad during attachment of the die to the die attach pad.

To further aid in the reduction of delamination stress when a die attach pad includes multiple die attach sections, a stress relief section can be formed between a pair of defined die attach sections. The stress relief section may or may not be attached to the die; the latter may provide greater stress relief because the stress relief section is free to move independent of the die.

When a die attach pad includes multiple die attach sections, it may be beneficial to increase the number of, or spacing between, die attach sections or rows of die attach sections along a major axis of the die attach pad relative to the number of, or spacing between, die attach sections or rows of die attach sections along a minor axis of the die attach pad. Specifying the formation of the die attach sections in this manner can facilitate balancing of a die on the die attach pad during attachment of the die.

It can also be advantageous to form the die attach pad so that the die attach section(s) are recessed, with respect to the die, relative to the bonding support section(s). Such recessing can reduce or eliminate any gap between a bonding support section and the die that would otherwise exist as a result of the presence of the die attach material between the die attach pad and the die, thus enhancing the support of the die provided by the bonding support section(s) during bond wire attachment.

Dimples can also be formed in a die attach section of a die attach pad according to the invention. Die attach material that fills in the dimples may provide better interlocking of the die attach material (and, thus, the die) with the die attach pad.

In a die attach pad according to the invention, it can also be advantageous to form holes proximate to an edge of the die attach pad. The formation of such holes can reduce encapsulant stress. The holes can also enable the encapsulant to interlock with the die attach pad, thereby attaching the encapsulant to the die attach pad more securely than would otherwise be the case. Additionally, the interlocking can alleviate encapsulant stress. The size, shape and/or location of the holes can be controlled so that sufficient material is left in the die attach pad to ensure adequate support under the bond pads during bond wire attachment.

Delamination stress during heating is reduced by the invention. Thus, for a particular packaged die, the invention decreases the likelihood of encapsulant delamination during heating of the packaged die. Alternatively, the invention can enable use with a packaged die of an encapsulant material that is more moisture sensitive (e.g., more porous or having more of an affinity for water or other moisture)—and, therefore, typically less expensive—than a previously used encapsulant material, without increasing the likelihood of delamination. As is apparent, it is also possible to choose an encapsulant material that is somewhat more moisture sensitive than a previously used encapsulant material, yet also results in some decrease in the likelihood of delamination.

The invention also provides a die attach pad having a bonding support section formed to be adjacent to an attached die opposite locations where bond pads are formed. Thus, the die is supported at such locations during attachment of bond wires to bond pads. It is not necessary, therefore, to use special wirebonding techniques to minimize the possibility of damage to the die as a result of forces applied to the die during attachment of the bond wires to bond pads. Nor is it necessary, in packaged die including a heater block, to modify the heater block to have raised portions that support the die underneath the locations of bond pads.

DETAILED DESCRIPTION OF THE INVENTION

According to the invention, a die can be attached to a die attach pad so as to reduce die attach stress that can arise when the die and die attach pad are heated, and so as to provide support for the die at locations where bond pads are formed so that the die is not damaged by forces applied to the die during attachment of bond wires to the bond pads. The die and die attach pad so attached can be used to produce a packaged die having improved delamination characteristics (one in which encapsulant stress during heating is reduced as well as die attach stress), so that the cost to manufacture and/or store the packaged die can be reduced. The invention further provides die attach pads and leadframes including such die attach pads that are particularly suited to achieving the aforementioned functional characteristics.

Figure 6A:
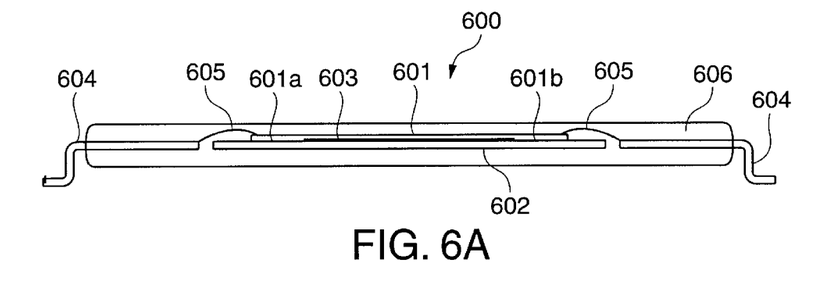
FIG. 6A is a cross-sectional side view (viewed in the direction of the sectional line 6A—6A of FIG. 6B) of a packaged die according to an embodiment of the invention.

FIG. 6A is a cross-sectional side view (viewed in the direction of the sectional line 6A—6A of FIG. 6B) of a packaged die 600 according to an embodiment of the invention. The packaged die 600 is similar to the packaged die 100 described above with respect to FIGS. 1A and 1B. Like the packaged die 100, in the packaged die 600, a die attachment surface of the die 601 is attached to a die attach pad attachment surface of a die attach pad 602 with a die attach material 603. Each of a set of bond wires 605 are attached to, and extend between, one of a set of bond pads 607 (see FIG. 6B) formed on the die 601 and a portion of a corresponding one of a set of leads 604 formed proximate to the die 601. The die 601, die attach pad 602, die attach material 603, bond wires 605 and an inner portion of the leads 604 are encapsulated by an encapsulant 606.

Figure 6B:
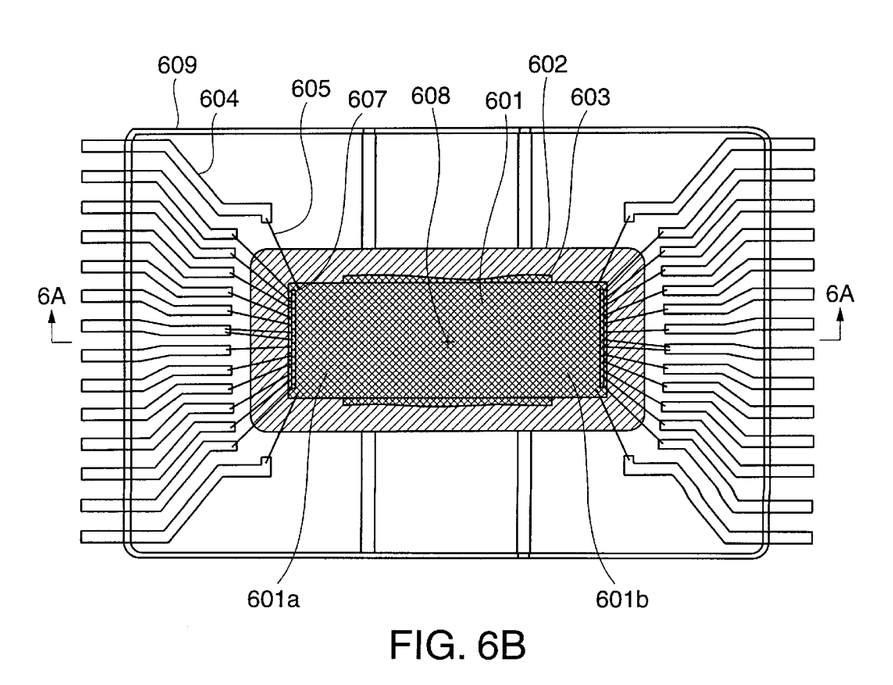
FIG. 6B is a plan view of the die, die attach pad, die attach material, leads and bond wires of the packaged die of FIG. 6A.

FIG. 6B is a plan view of the die 601, die attach pad 602, die attach material 603, leads 604 and bond wires 605 of the packaged die 600 prior to encapsulation in the encapsulant 606. As shown in FIG. 6B, the die attach pad 602 and the leads 604 are connected by a frame 609 to form an integral leadframe that facilitates the manufacture and assembly of the packaged die 600.

As best seen in FIG. 6B, unlike the packaged die 100 described above, the die attach material 603 does not attach all of the die attachment surface of the die 601 to the die attach pad 602. (Herein, a section of a die attach pad to which a die attach material attaches a die is sometimes referred to as a "die attach section.") Thus, the packaged die 600 experiences reduced die attach stress during heating, as compared to the packaged die 100. In particular, sections of the die 601 (designated by the numerals 601a and 601b) that are most distant from the center 608 of the die 601 are left unattached, thus producing a large reduction in die attach stress, since the die 601 and die attach pad 602 are unattached at locations where the die attach stress would otherwise be greatest (as explained above and illustrated in FIG. 2).

Moreover, sections of the die attach pad 602 are adjacent to the die 601 at locations opposite to the locations of the bond pads 607. (Herein, a section of a die attach pad that provides support for a die at the location of a bond pad on the die is sometimes referred to as a "bonding support section.") Thus, unlike the packaged die 300 described above with respect to FIGS. 3A and 3B, the die 601 of the packaged die 600 is adequately supported during attachment of the bond wires 605 to the bond pads 607.

The use of a die attach material to attach to a die attach pad only part, rather than all, of the die attachment surface of a die that is adjacent to an attachment surface of the die attach pad is contrary to well-established practice in the assembly of packaged die. (See, e.g., FIGS. 1A and 1B, 3A and 3B, 4A and 4B, and 5 and accompanying description above.) Such practice may be thought to be necessary, for example, so that moisture is not trapped in the space between the die and attach pad that would be present where die attach material is not used. However, partial attachment of the adjacent sections of a die attachment surface and a die attach pad attachment surface, as provided by the invention, can enable the realization of two important beneficial characteristics in a packaged die: reduction of die attach stress and provision of die support under the bond pads during attachment of bond wires to the bond pads.

Figure 7A:
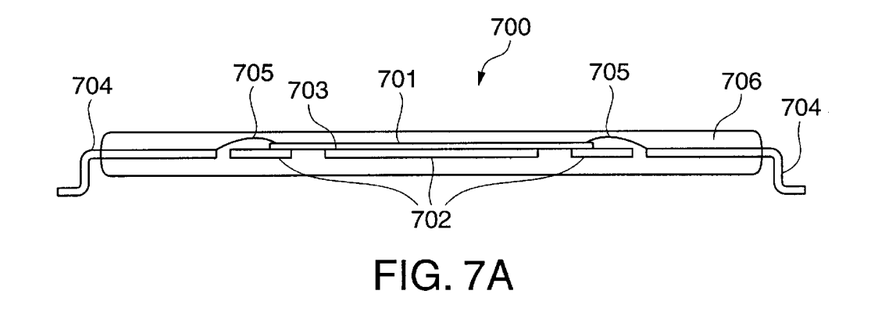
FIG. 7A is a cross-sectional side view (viewed in the direction of the sectional line 7A—7A of FIG. 7B) of a packaged die according to another embodiment of the invention.
Figure 7B:
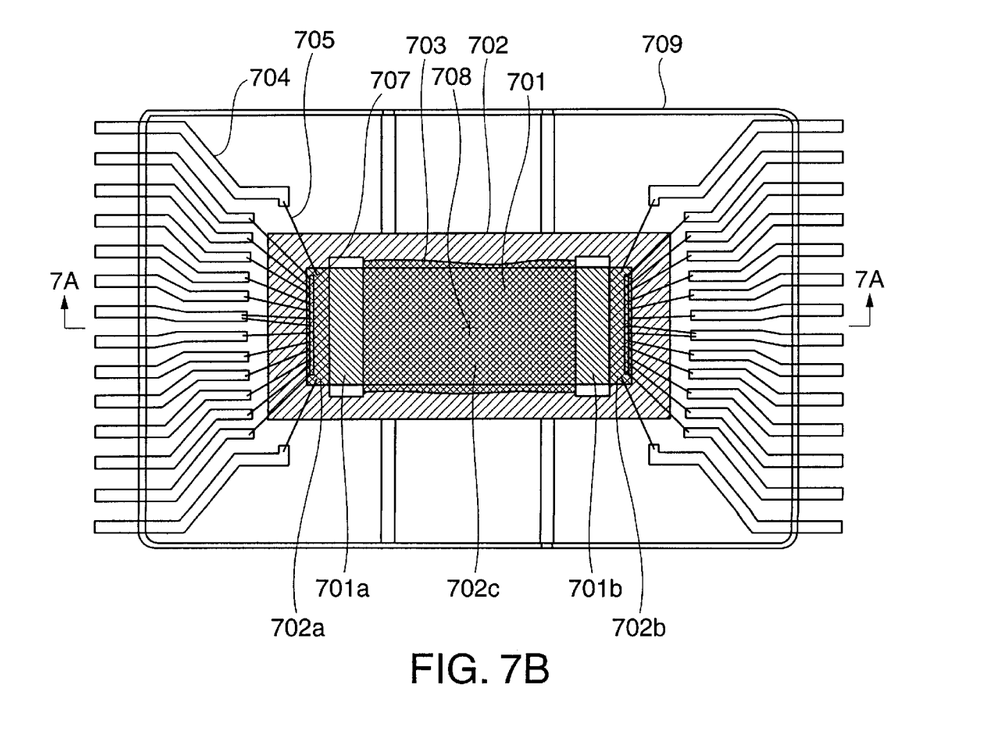
FIG. 7B is a plan view of the die, die attach pad, die attach material, leads and bond wires of the packaged die of FIG. 7A.

FIG. 7A is a cross-sectional side view (viewed in the direction of the sectional line 7A—7A of FIG. 7B) of a packaged die 700 according to another embodiment of the invention, including a die 701, die attach pad 702, die attach material 703, bond wires 705 and leads 704 that are encapsulated (in the case of the leads 704, only an inner portion) by an encapsulant 706. FIG. 7B is a plan view of the die 701, die attach pad 702, die attach material 703, leads 704 (which are connected to the die attach pad 702 by a frame 709 to form an integral leadframe) and bond wires 705 of the packaged die 700 prior to encapsulation in the encapsulant 706. The packaged die 700 is similar to the packaged die 400 described above with respect to FIGS. 4A and 4B; however, as explained below, the packaged die 700 differs in construction in a manner that provides improved characteristics as compared to the packaged die 400.

Unlike the packaged die 100 described above with respect to FIG. 1, and like the above-described packaged die 600 according to the invention, the die attach material 703 does not attach all of the die attachment surface of the die 701 to the die attach pad 702. Thus, as in the packaged die 600, the packaged die 700 experiences reduced die attach stress during heating, as compared to the packaged die 100. Further, like the packaged die 600, since the unattached sections 701a and 701b of the die 701 are the sections of the die 701 that are most distant from the center 708 of the die 701, a large reduction in die attach stress is achieved.

However, since material has been removed from the die attach pad 702 to create a defined die attach section 702c, the packaged die 700 experiences reduced encapsulant stress as well. Thus, the die attach pad 702 results in reduced overall delamination stress in the packaged die 700 as compared to that produced by the die attach pad 602 in the packaged die 600.

Further, in the packaged die 600, it may be necessary to carefully control the application of the die attach material 603 to ensure that the die attach material 603 does not cover more of the attachment surface of the die attach pad 602 than desired, so that the die 601 will not be attached to the die attach pad 602 beyond a desired distance from the center 608 of the die 601 (i.e., so that die attach stress is eliminated in regions that would otherwise experience high die attach stress). Such control may be necessary, for example, because pressing the die 601 on to the die attach material 603 on the attachment surface of the die attach pad 602 can exert a force that tends to squeeze the die attach material 603 so that the die attach material 603 spreads out over the attachment surface of the die attach pad 602 in a relatively uncontrolled fashion. In the packaged die 700, on the other hand, the application of the die attach material 703 to the attachment surface of the die attach pad 702 may not need to be as carefully controlled, since, if die attach material 703 is squeezed, as described above, during placement of the die 701 on the die attach pad 702, the die attach material 703 can pass through the hole in the die attach pad 702 formed by the removal of material from the die attach pad 702, rather than spread over the attachment surface of the die attach pad 702, thus preventing attachment of the die 701 beyond a desired distance from the center 708 of the die 701. Not only does removal of material from the die attach pad 702 eliminate the need to carefully control the application of the die attach material 703 to the die attach pad 702, the die attach material 703 that solidifies in the hole (and, possibly, on the surface of the die attach pad 702 opposite the surface to which the die 701 is attached) can cause the die attach material 703 (and, thus, the die 701) to better interlock with the die attach pad 702.

Additionally, unlike the packaged die 300 of FIGS. 3A and 3B, in the packaged die 700, material is removed from the die attach pad 702 so that sections 702*a* and 702*b* of the die attach pad 702 remain adjacent to the die attachment surface of the die 701 opposite the locations of bond pads on the opposite surface of the die 701. Thus, support is provided for the die 701 during the attachment of the bond wires 705 to the bond pads 707 on the die 701, as in the packaged die 600 according to the invention. Such support is also provided in the packaged die 400 described above with respect to FIGS. 4A and 4B. However, unlike the packaged die 400 (or the packaged die 100, 300 or 500 described above), in the packaged die 700, die attach material 703 is used only to attach the die 701 to the attachment surface of the die attach pad 702 near the center 708 of the die 701 and die attach pad 702, rather than to all parts of the attachment surface of the die attach pad 702 adjacent to the die 701. The parts of the attachment surface of the die attach pad 702 that are relatively distant from the center 708—and, in particular, the surfaces of the sections 702*a* and 702*b* of the die attach pad 702 that underlie the locations on the die 701 at which the bond pads 707 are formed—are not attached to the die 701. Thus, unlike the packaged die 100, 300, 400 or 500, the packaged die 700 experiences (as do the other embodiments of the invention described herein) significantly reduced die attach stress during heating of the packaged die 700, yet does not suffer from a lack of support under the bond pads 707 of the die 701 when bond wires 705 are attached to the bond pads 707 during manufacture of the packaged die 700.

A packaged die according to the invention reduces die attach stress by eliminating attachment of some part of the attachment surface of the die to the die attach pad. Thus, in general, it can be desirable to minimize the area of the attachment surface of the die that is attached to the die attach pad. (Notwithstanding the foregoing, it is necessary or desirable to attach at least a minimum area of the attachment surface of the die to the die attach pad to ensure adequate attachment of the die to the die attach pad.) For example, it can be desirable to attach the die to the die attach pad so that, in one embodiment, no more than about 60%—and, in additional embodiments, no more than about 54% or no more than about 48%—of the area of the attachment surface of the die is attached to the die attach pad. It can also be desirable to attach the die to the die attach pad so that at least about 6%—and, in additional embodiments, at least about 10% or at least about 14%—of the area of the attachment surface of the die is attached to the die attach pad. In one particular embodiment, the die is attached to the die attach pad so that about 30% of the area of the attachment surface of the die is attached to the die attach pad.

As discussed above with respect to FIGS. 7A and 7B, it can be desirable to control the area of the die attach section of a die attach pad by selectively removing material to provide a defined die attach section. (See FIGS. 7A and 7B, discussed above, and FIGS. 8A and 8B, 9A and 9B, and 10A and 10B, discussed below.) The reduction of delamination stress (both die attach stress and encapsulant stress) associated with minimizing the size of the die attach section militates in favor of removing as much material from the die attach area (i.e., the area on a die attach pad defined by the periphery of a die when the die is attached to the die attach pad) as possible. However, as more material is removed from the die attach area, the heat dissipative capacity of the die attach pad decreases, militating against the removal of material from the die attach area. (The characteristics of the shape of the remaining die attach material can also have an effect on the heat dissipative capacity of the die attach pad.) Further, leaving more material in the die attach area provides greater flexibility in using the die attach pad for dice of different sizes. The amount of material removed from the die attach area of a die attach pad to produce a die attach pad in accordance with the invention can be chosen in view of these considerations (as well as consideration of the minimum area necessary to provide adequate attachment of the die). For example, in one embodiment of the invention, the area of the attachment surface of a die attach section of a die attach pad is no more than about 50%—and, in additional embodiments, no more than about 45% or no more than about 40%—of the die attach area of the attachment surface of the die attach pad. In another embodiment of the invention, the area of the attachment surface of a die attach section of a die attach pad is at least about 5%—and, in additional embodiments, at least about 8% or at least about 11%—of the die attach area of the attachment surface of the die attach pad. In one particular embodiment, the area of the attachment surface of a die attach section of a die attach pad is about 25% of the die attach area of the attachment surface of the die attach pad. The formation of a die attach pad having material removed therefrom as described herein can readily be accomplished using, for example, conventional etching or stamping techniques, as known by those skilled in the art.

To reduce die attach stress as much as possible, preferably, attachment of the attachment surface of a die at a location or location that is farthest from the center of the die is eliminated. According to one embodiment of the invention, the attachment surface of the die is not attached to the die attach pad beyond a distance ("actual die attach distance") from the center of the attachment surface of the die that is greater than about 75% of the distance ("maximum possible die attach distance") to the location or locations on the attachment surface of the die that are farthest from the center of the attachment surface. According to another embodiment, the actual die attach distance is about 50% of the maximum possible die attach distance. According to still another embodiment, the actual die attach distance is about 25% of the maximum possible die attach distance. The actual die attach distance as a percentage of maximum possible die attach distance can be affected by, for example, the size and shape (e.g., square or rectangular) of the die and the particular construction (e.g., number and location of die attach sections) of the die attach pad.

As discussed above, die attach stress produced by heating of a die and die attach pad can include "differential CTE stress" and "moisture expansion stress." The invention reduces differential CTE stress in the die attach material by eliminating attachment of at least some of the attachment surface of the die to the die attach pad. Differential CTE stress is especially reduced by embodiments of the invention that eliminate such attachment at locations that are farthest from the center of the die. Further, since the invention makes use of less die attach material than previously used with a particular packaged die, moisture expansion stress may be reduced since there is less material in the die attach region that is susceptible to the collection of moisture that expands upon heating. Since, in a packaged die according to the invention, the die attach stress produced by the heating the packaged die is reduced as compared to that produced in a previous packaged die, the die of a packaged die according to the invention is less likely to detach from the die attach pad when the packaged die is heated than is the die of a previous packaged die, resulting in a reduced likelihood of encapsulant delamination during heating of a packaged die according to the invention as compared to a previous packaged die. Further, since material can be eliminated from the die attach pad of a packaged die according to the invention, differential CTE stress in the encapsulant can be reduced, thereby further reducing the likelihood of encapsulant delamination during heating of the packaged die.

As described above, the ingress of moisture into a packaged die can result in delamination of the encapsulant when the moisture expands during heating of the packaged die. To minimize this problem it is sometimes necessary or desirable to "dry pack" the packaged die after manufacture to provide some insulation of the packaged die from moisture ingress. It may also be necessary or desirable, after a packaged die has been stored for a period of time before use, to "dry bake" the packaged die to force out moisture collected in the packaged die. The invention can improve the delamination characteristics of a packaged die so that dry packing and/or dry baking are not necessary in some or all situations.

As indicated above, use of the invention with a particular packaged die reduces the likelihood of encapsulant delamination when that packaged die is heated. Alternatively, the invention can enable use with a packaged die of an encapsulant material that is more moisture sensitive (e.g., more porous or having more of an affinity for water or other moisture)—and, therefore, typically less expensive—than a previously used encapsulant material, without increasing the likelihood of delamination. As is apparent, it is also possible to choose an encapsulant material that is somewhat more moisture sensitive than a previously used encapsulant material, yet also results in some decrease in the likelihood of delamination.

In any case (i.e., whether the invention allows a more moisture sensitive encapsulant to be used, enables elimination of process steps designed to remove moisture from a packaged die, or provides a combination of both), the invention reduces or eliminates a cost or costs associated with the manufacture and storage of a packaged die. Typically, these reductions in cost are far greater than any additional cost necessitated by use of the invention (e.g., cost associated with more careful control of the application of die attach material to a die attach pad, or cost associated with removing material from a die attach pad to produce a defined die attach region).

As known by those skilled in the art, packaged die can be classified according to their moisture sensitivity (i.e., the susceptibility of the packaged die to collecting moisture therein), indicated by a moisture level number. The higher the moisture level number, the more easily moisture can enter and collect within the packaged die. A packaged die having a moisture level of 5, for example, collects moisture therein very easily; such a packaged die must be dry baked before use. A packaged die having a moisture level of 3 is more resistant to collection of moisture; such a packaged die must be dry packed for shipping and will also need to be dry baked unless used within about one week after being unpacked. A packaged die having a moisture level of 1 is very resistant to moisture collection; such a packaged die need not be dry packed for shipping and, after unpacking, may be stored for an indefinite time before use.

A packaged die including a conventional die attach pad (i.e., die attach pad 102 of FIGS. 1A and 1B) encapsulated within an encapsulant comprised of a standard molding compound (e.g., an OCN-based epoxy molding compound) often has a moisture level of 5. If a premium (i.e., less moisture sensitive and, typically, more expensive) molding compound is used (e.g., a biphynol-based molding compound), the moisture level can be reduced to 3. In comparison, the invention enables a packaged die to include an encapsulant comprised of a standard molding compound while still maintaining a moisture level of 3. Further, if the invention is used in a packaged die together with an encapsulant comprised of a premium molding compound, a moisture level of 1 can be achieved.

As described above, the invention also provides a die attach pad having one or more sections formed to be adjacent to an attached die opposite locations where bond pads are formed. Thus, the die is supported at such locations during attachment of bond wires to bond pads during manufacture of a packaged die. It is not necessary, therefore, to use special wirebonding techniques to minimize the possibility of damage to the die as a result of forces applied to the die during attachment of the bond wires to bond pads. Further, in a packaged die including a heater block, the invention eliminates the need to produce a specially formed (and, therefore, more expensive and possibly more difficult to assemble as part of the packaged die) heater block having raised portions that provide support for the die at location(s) on the die attachment surface at which such support is needed during the bond wire attachment process (see FIG. 5 and accompanying description above).

In short, the invention provides significantly reduced delamination stress during heating of a die attached to a die attach pad, while also providing support under the bond pads of the die during attachment of bond wires to the bond pads. None of the packaged die described above with respect to FIGS. 1A and 1B, 3A and 3B, 4A and 4B, or 5 provide such dual benefits.

As indicated above, to reduce delamination stress, it is generally desirable to remove material from the die attach area of a die attach pad so as to create a relatively small, defined die attach section. However, as the die attach section becomes smaller, it can become more difficult to balance a die on a single centrally located die attach section (see, e.g., FIGS. 7A and 7B) during attachment of the die to the die attach pad. This can, in particular, create or exacerbate problems during wirebonding that result from teetering of the die on the die attach section. Thus, it can be desirable to divide a die attach section of a die attach pad according to the invention into two or more die attach sections having the same amount of total attachment surface area as the single die attach section. This is illustrated in FIGS. 8A, 8B.

Figure 8A:
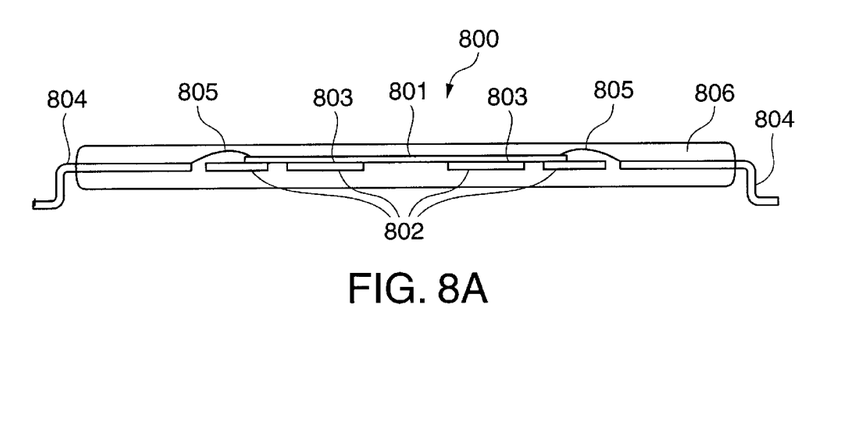
FIG. 8A is a cross-sectional side view (viewed in the direction of the sectional line 8A—8A of FIG. 8B) of a packaged die according to still another embodiment of the invention.

FIG. 8A is a cross-sectional side view (viewed in the direction of the sectional line 8A—8A of FIG. 8B) of a packaged die 800 according to still another embodiment of the invention. FIG. 8B is a plan view of a die 801, die attach pad 802, die attach material 803, leads 804 (which are connected to the die attach pad 802 by a frame 809 to form an integral leadframe) and bond wires 805 of the packaged die 800 prior to encapsulation in an encapsulant 806 (see FIG. 8A).

The die attach pad 802 includes two die attach sections 802a and 802b and two bonding support sections 802c and 802d. The die attach sections 802a and 802b are positioned so that the centers of the die attach sections 802a and 802b lie on a major axis of the die attach pad 802 and are equidistant from a minor axis of the die attach pad 802. (Herein, "major and minor axes" of a die attach pad are defined with respect to a die that is placed on the die attach pad with an intended location and orientation, and with respect to a view of the die attach pad in a direction perpendicular to the attachment surface of the die attach pad. A "major axis" of a die attach pad is defined to be an axis that is parallel to a line extending through the center 808 of the die and between the edges of the die that are farthest apart. A "minor axis" is defined to be an axis that is perpendicular to the major axis.) The symmetric (relevant to the intended location and orientation of the die 801) positioning of the die attach sections 802a and 802b facilitates balancing of the die 801 on the die attach pad during the attachment of the die 801. The two bonding support sections 802c and 802d are positioned so that when the die 801 is attached to the die attach pad 802, the bonding support sections 802c and 802d are adjacent to locations on the attachment surface of the die 801 opposite bond pads 807 formed on the opposite surface of the die 801, thus providing support of the die during attachment of bond wires 805 to the bond pads 807, as described in more detail above.

Figure 8B:
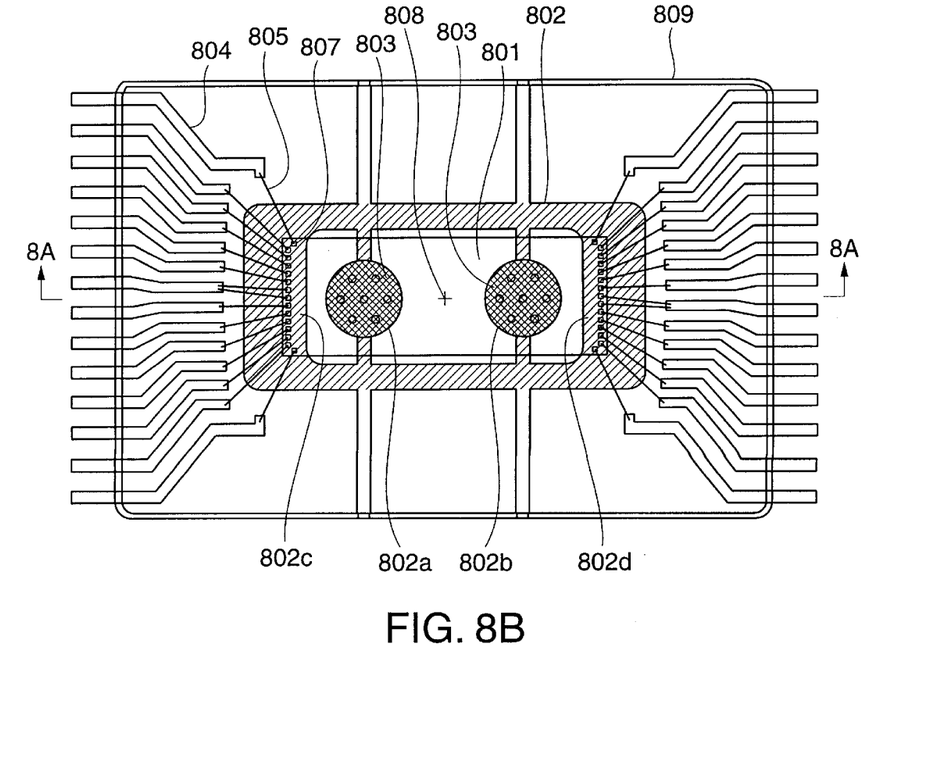
FIG. 8B is a plan view of the die, die attach pad, die attach material, leads and bond wires of the packaged die of FIG. 8A.

As illustrated in FIGS. 8A and 8B, dimples are formed on the die attach sections 802a and 802b. (The dimples need not necessarily be present on the die attach sections 802a and 802b, however.) Die attach material fills in the dimples, aiding in the interlocking of the die attach material (and, thus, the die) with the die attach pad. Though not shown, dimples can be formed on the die attach sections of the other embodiments of a die attach pad according to the invention described herein (as well as, generally, any die attach pad according to the invention).

Figure 9A:
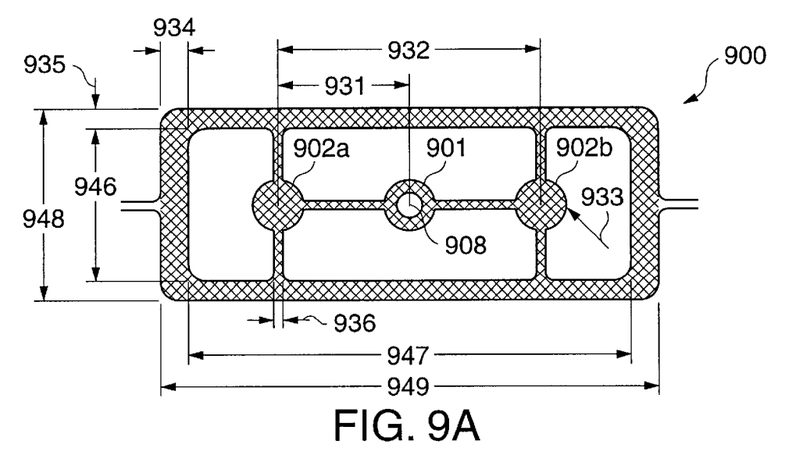
FIGS. 9A through 9C are plan views of die attach pads according to other embodiments of the invention.
Figure 9B:
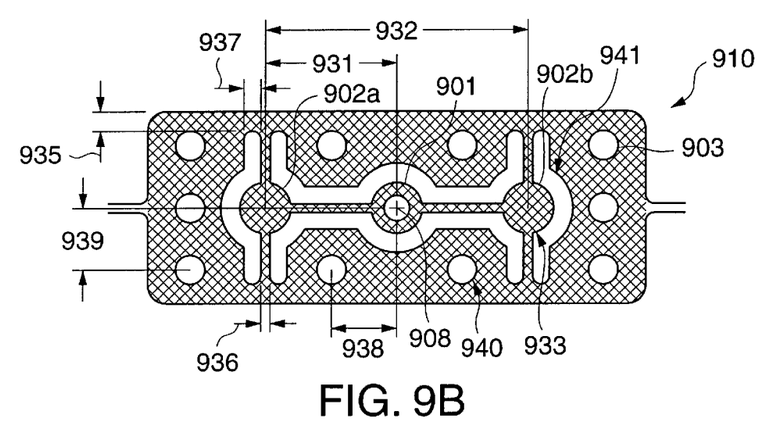
Figure 9C:
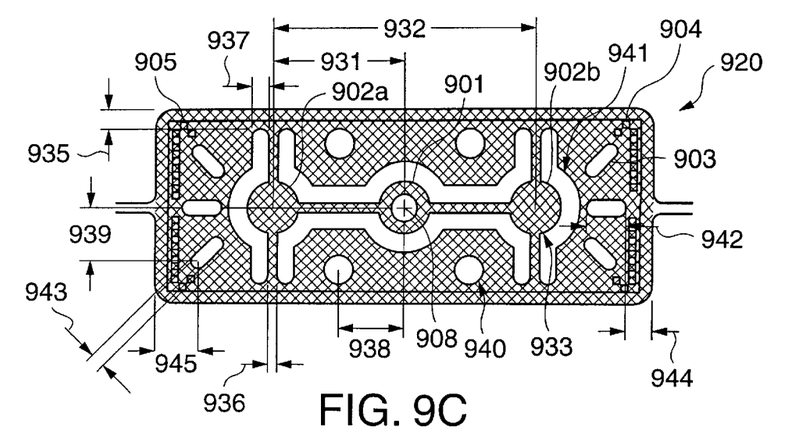

FIGS. 9A through 9C are plan views of die attach pads 900, 910, and 920, respectively, according to other embodiments of the invention. (In FIG. 9C, to enhance the illustration and description of the die attach pads 900, 910 and 920, a die 904 is shown attached to the die attach pad 920; though not shown in FIGS. 9A and 9B, the die 904 can also be attached to the die attach pads 900 and 910, respectively, at the same location and with the same orientation.) The die attach pads 900, 910, and 920 are similar to the die attach pad 802 of the packaged die 800 (FIGS. 8A and 8B). Each of the die attach pads 900, 910, and 920 include two die attach sections 902a and 902b that are positioned in the same manner (though not necessarily in exactly the same locations) as the die attach sections 802a and 802b. Each of the die attach pads 900, 910, and 920 also includes a stress relief section 901 having a hole formed concentrically therein. The stress relief section 901 is located between the two die attach sections 902a and 902b and centered on the center 908 of the die attach pad 900, 910 or 920.

A die (e.g., die 904 in FIG. 9C) is attached to the die attach sections 902a and 902b. The die can either be attached or not attached to the stress relief section 901. The stress relief section 901 can provide stress relief to alleviate differential CTE stress. This is particularly so if the stress relief section 901 is not attached to the die, because the stress relief section 901 is free to move independent of the die.

In the die attach pads 910 (FIG. 9B) and 920 (FIG. 9C), holes (designated singly or collectively by the numeral 903) are formed proximate to the edges of the die attach pads 910 and 920. The formation of such holes can reduce encapsulant stress. The holes can also enable the encapsulant to interlock with the die attach pad, thereby attaching the encapsulant to the die attach pad more securely than would otherwise be the case. Additionally, the interlocking can alleviate encapsulant stress. Further, as best seen in FIG. 9C, the formation of the holes 903 in the area of the die attach pad adjacent the die at locations at which bond pads 905 are formed on the die still leaves die attach pad material to support the die during attachment of bond wires to the bond pads. In general, it can be desirable to make the holes 903 as large as possible while leaving enough material in the die attach pad 910 or 920 to ensure that the die can be adequately supported during bond wire attachment. Some illustrative dimensions for the holes 903 are given below.

In the die attach pad 910, all of the holes 903 are circular. In the die attach pad 920, the holes proximate to the opposite edges of the die attach pad 920 that are farthest from each other have an elongated "racetrack" shape, rather than a circular shape. The elongated holes can provide better support of the die during bond wire attachment, since relatively more die attach pad material is present adjacent the die. The added support may be particularly important if the die that is attached to the die attach pad is smaller than the die 904 so that the edges of the die proximate to the bond pads are adjacent to the holes, rather than to part of the die attach pad (as is the case with the die 904).

Following are illustrative nominal magnitudes of some of the dimensions of the die attach pads 900, 910 and 920. These nominal magnitudes are specified with a tolerance of 2 mils. It is to be understood that other magnitudes are encompassed by the principles of the invention. In particular, the magnitudes of these dimensions may change depending upon the size of the die that is to be attached to the die attach pad 900, 910 or 920. (The rectangular die 904 shown in FIG. 9C measures 163 mils by 455 mils.) The distance 946 is 143 mils. The distance 947 is 445 mils (and is preferably no more than that). The distances 948 and 949 are 173 mils and 465 mils, respectively (and are preferably no more than that). The distance 931 is 117.6 mils. The distance 932 is 235.2 mils. The diameter 933 is 50 mils. (Preferably the diameter 933 is made no less than about 40 mils and no more than about 100 mils.) The distance 934 is 30 mils. The distance 935 is 18 mils. The distance 936 is 10 mils. The distance 937 is 20 mils. The distance 938 is 60 mils. The distance 939 is 50 mils. The diameter 940 is 36 mils. The diameter 941 is 90 mils. The distance 942 is 37.5 mils. The distance 943 is 15 mils. The distance 944 is 25.3 mils. The distance 945 is 40.6 mils.

Figure 10A:
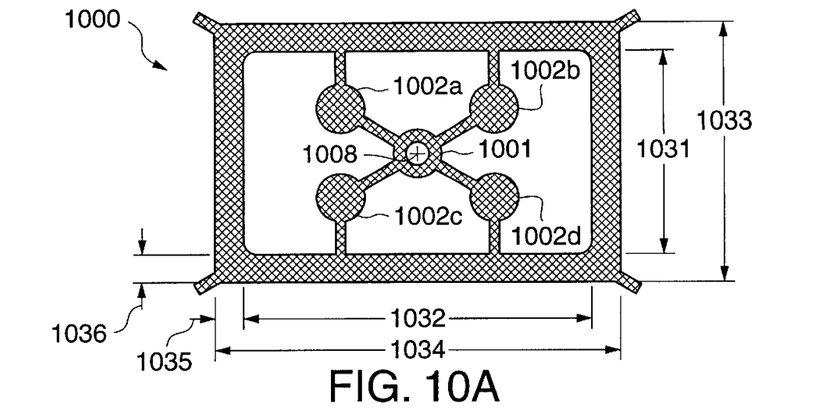
FIGS. 10A through 10C are plan views of die attach pads according to still other embodiments of the invention.
Figure 10B:
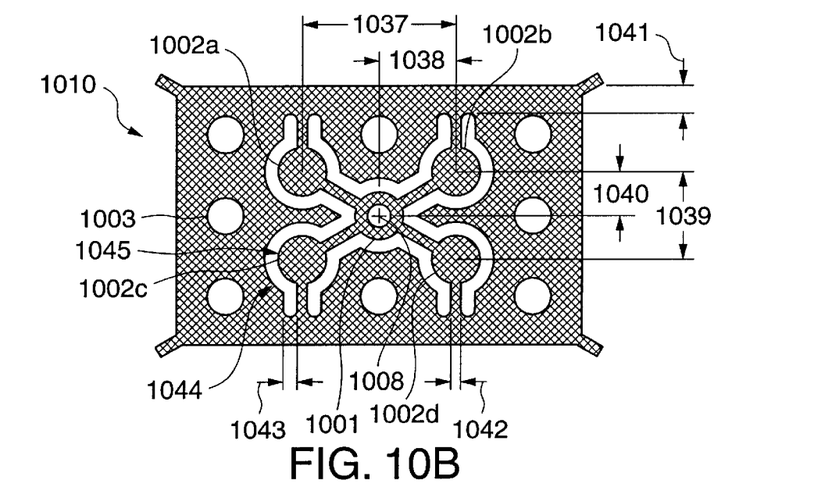
Figure 10C:
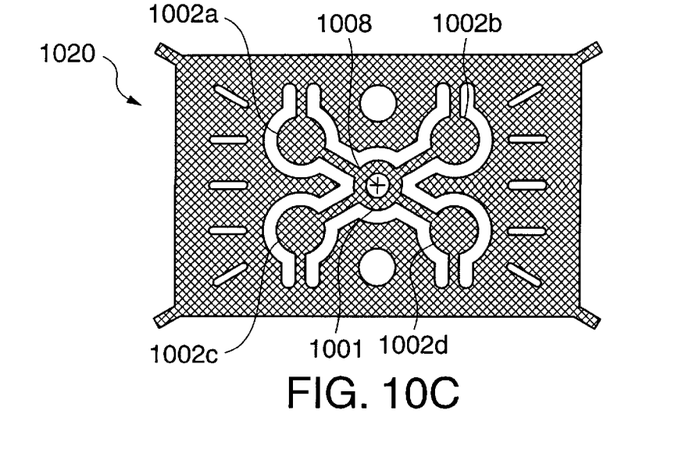

The number and placement of die attach sections in a die attach pad according to the invention can depend on the aspect ratio of the die attach pad. An "aspect ratio" of the die attach pad is defined to be the length of the die attach pad along a major axis divided by the length of the die attach pad along a minor axis. (In accordance with the definitions of "major axis," "minor axis" and aspect ratio" herein, the aspect ratio is always greater than or equal to 1.) Generally, as the aspect ratio of a die attach pad increases, it can be desirable to increase the number of, or spacing between, die attach sections or rows of die attach sections along the major axis relative to the number of, or spacing between, die attach sections or rows of die attach sections along the minor axis. This is illustrated in FIGS. 10A, 10B and 10C. Specifying the formation of the die attach sections in this manner can facilitate balancing of a die on the die attach pad during attachment of the die.

The number and placement of die attach sections in a die attach pad according to the invention can also depend on the size of the die attach sections relative to the overall size of the die attach pad (which will generally be slightly larger than the largest die that it is intended to attach to the die attach pad). For example, assuming that the die attach sections are the same size and shape, the number of die attach sections along the major and minor axes of a die attach pad can be related to the ratio of the magnitude of an outer dimension (e.g., diameter, chord or width) of the die attach pad along such axis to the magnitude of an outer dimension (e.g., diameter, chord or width) of a die attach section along such axis. For example, if such ratio is greater than about 4, it can be desirable to use two die attach sections along that axis. Or, for example, if such ratio is greater than about 7, it can be desirable to use three die attach sections along that axis.

FIGS. 10A through 10C are plan views of die attach pads 1000, 1010, and 1020, respectively, according to still other embodiments of the invention. Each of the die attach pads 1000, 1010, and 1020 include four die attach sections 1002a, 1002b, 1002c and 1002d that are positioned so that the die attach sections 1002a and 1002b are located symmetrically with respect to the die attach sections 1002c and 1002d about the major axis, and the die attach sections 1002a and 1002c are located symmetrically with respect to the die attach sections 1002b and 1002d about the minor axis. Each of the die attach pads 1000, 1010, and 1020 also includes a stress relief section 1001 having a hole formed concentrically therein (similar to the stress relief section 901 of the die attach pads 900, 910 and 920, described above). The stress relief section 1001 is located between, and equidistant from, the die attach sections 1002a, 1002b, 1002c and 1002d, and is centered on the center 1008 of the die attach pad 1000, 1010 or 1020.

A die is attached to the die attach sections 1002a, 1002b, 1002c and 1002d, and can either be attached or not attached to the stress relief section 1001. Like the stress relief section 901 of the die attach pads 900, 910 and 920, the stress relief section 1001 can provide stress relief to alleviate differential CTE stress in the die attach pads 1000, 1010 and 1020, particularly if the stress relief section 1001 is not attached to the die. Like the die attach pads 910 and 920, holes 1003 are formed proximate to the edges of the die attach pads 1010 (FIG. 10B) and 1020 (FIG. 10C), providing benefits in the same manner as described above with respect to the holes 903 formed in die attach pads 910 and 920. Additionally, analogous to the die attach pads 910 and 920, the holes proximate to the opposite edges of the die attach pad 1020 that are farthest from each other have an elongated "racetrack" shape, providing better support of the die during bond wire attachment than the circular holes of the die attach pad 1010.

As indicated above, as the aspect ratio of a die attach pad increases, it can be desirable to increase the number of, or spacing between, die attach sections or rows of die attach sections along the major axis relative to the number of, or spacing between, die attach sections or rows of die attach sections along the minor axis (particularly when the die attach sections all have the same size). In FIGS. 10A, 10B and 10C, an equal number (two) of rows of die attach sections are formed along each of the major and minor axes. Thus, though the aspect ratio of the die attach pads 1000, 1010 and 1020 is greater than 1, the aspect ratio has been considered not to be sufficiently greater than 1 to warrant forming more rows of die attach sections along the major axis than along the minor axis. Nevertheless, the distance between the rows of die attach sections along the major axis has been made greater than the distance between the rows of die attach sections along the minor axis (i.e., the distance 1032 is greater than the distance 1035).

Following are illustrative nominal magnitudes of some of the dimensions of the die attach pads 1000, 1010 and 1020. These nominal magnitudes are specified with a tolerance of 0.05 mm. It is to be understood that other magnitudes are encompassed by the principles of the invention. In particular, the magnitudes of these dimensions may change depending upon the size of the die that is to be attached to the die attach pad 1000, 1010 or 1020. (Illustratively, a rectangular die, not shown in FIGS. 10A through 10C, measuring 6.3680 mm by 9.9180 mm can be centrally located on, and attached to, the die attach pad 1000, 1010 or 1020.) The distance 1031 is 5.6160 mm. The distance 1032 is 9.1660 mm (and is preferably no more than that). The distances 1033 and 1034 are 7.1200 mm and 10.6700 mm, respectively (and are preferably no more than that). The distance 1035 is 0.7520 mm. The distance 1036 is 0.7520 mm. The distance 1037 is 4.0010 mm. The distance 1038 is 2.0005 mm. The distance 1039 is 2.6699 mm. The distance 1040 is 1.3350 mm. The distance 1041 is 0.7520 mm. The distance 1042 is 0.2546 mm. The distance 1043 is 0.5080 mm. The diameter 1044 is 2.286 mm. The diameter 1045 is 1.270 mm.

If the die attach section(s) and the bonding support section(s) of a die attach pad according to the invention are formed so that the surfaces of those sections that are adjacent to the die are in the same plane, the presence of the die attach material between the die attach section(s) and the die can result in a gap between the bonding support section(s) and the die. This gap may allow bowing of the die (up to the point at which the die contacts the bonding support section (s)) at the locations of the bond pads when bond wires are attached to the bond pads. Such bowing may result in poor contact between the wirebonding tool and a bond pad so that the bond wire is inadequately attached to the bond pad. For example, in such a situation, ultrasonic bonding can cause the die to vibrate so that poor bond wire attachment may result.

A die attach pad according to the invention can be formed so that, when a die is attached to the die attach pad, the surfaces of the die attach section(s) of the die attach pad are relatively farther away ("recessed") from the die than the bonding support section(s) of the die attach pad. This can enable the bonding support section(s) to provide better support of the die during bond wire attachment, since the gap between the die and the bonding support section(s) is reduced or eliminated. Ideally, the amount of the recess can be made equal to the expected thickness of the die attach material after the die is attached to the die attach pad. However, in practice, the recess may be made slightly smaller, so that, allowing for manufacturing tolerances, the die can be pressed down sufficiently onto the die attach material on the die attach section(s), before contact between the die and the bonding support section, to ensure a good attachment of the die to the die attach pad. Illustratively, the die attach section can be recessed between about 0.5 mils to about 2.5 mils (e.g., about 1 mil) with respect to the bonding support section. A die attach pad with recessed die attach section(s) as described above can readily be formed by, for example, stamping.

The invention can be used with any packaged die. In particular, it is anticipated that the invention will be particularly useful when used with a packaged semiconductor die (e.g., packaged integrated circuit), including, for example, packaged semiconductor die identified as TSOP (thin small outline package), SOJ (small outline with J-shaped leads), SOIC (small outline integrated circuit) or TQFP (thin quad flat package).

Various embodiments of the invention have been described. The descriptions are intended to be illustrative, not limitative. Thus, it will be apparent to one skilled in the art that certain modifications may be made to the invention as described above without departing from the scope of the claims set out below.

We claim:

1. A packaged die, comprising:
    a die having a first surface and a second surface opposite thereto, a bond pad being formed on the first surface; and
    a die attach pad to which the second surface of the die is attached, the die attach pad further comprising:
        a die attach section having an attachment surface to which the second surface of the die is attached, wherein the attachment surface of the die attach section is not attached to at least one of the location or locations on the second surface of the die that are farthest from the center of the second surface, and wherein one or more voids are formed in the die attach pad within a die attach area such that the area of the attachment surface of the die attach section is less than about 11% of the die attach area; and a bonding support section having a support surface that is adjacent to a location on the second surface of the die that is opposite the location of the bond pad on the first surface of the die, wherein the support surface is substantially coplanar with the attachment surface of the die attach section.

2. A packaged die as in claim 1, wherein the support surface of the bonding support section of the die attach pad is not attached to the die.

3. A packaged die as in claim 1, wherein the second surface of the die is not attached to the die attach pad beyond a distance from the center of the second surface that is greater than about 75% of the distance to the location or locations on the second surface of the die that are farthest from the center of the second surface.

4. A packaged die as in claim 1, wherein no more than about 60% of the area of the second surface of the die is attached to the die attach pad.

5. A packaged die as in claim 1, wherein one or more voids are formed in the die attach pad to create a plurality of defined die attach sections, the packaged die further comprising a stress relief section between a pair of defined die attach sections in the die attach pad.

6. A packaged die as in claim 5, wherein the stress relief section is not attached to the die.

7. A packaged die as in claim 5, wherein the number of, or spacing between, die attach sections or rows of die attach sections along a major axis of the die attach pad is greater than the number of, or spacing between, die attach sections or rows of die attach sections along a minor axis of the die attach pad.

8. A packaged die as in claim 1, wherein the attachment surface of the die attach section has dimples formed thereon.

9. A packaged die as in claim 1, wherein the die attach pad has holes proximate to an edge of the die attach pad.

10. A packaged die as in claim 9, wherein the bonding support section has holes.

11. A packaged die as in claim 1, further comprising:
a lead; and
a bond wire attaching the lead to the bond pad.

12. A packaged die as in claim 11, further comprising an encapsulant for encapsulating the die, die attach pad, bond wire and an inner portion of the lead.

13. A packaged die as in claim 12, further comprising:
a plurality of leads; and
a plurality of bond wires, wherein:
a plurality of bond pads are formed on the first surface of the die;
each bond wire attaches one of the plurality of leads to one of the bond pads;
the encapsulant further encapsulates an inner portion of each of the leads; and
the support surface of the bonding support section of the die attach pad is adjacent to locations on the second surface of the die that are opposite locations of bond pads on the first surface of the die.

14. A packaged die, comprising:
a die having a first surface and a second surface opposite thereto, a bond pad being formed on the first surface; and
a die attach pad, comprising:
a die attach section having an attachment surface to which the second surface of the die is attached, wherein one or more voids are formed in the die attach pad within a die attach area such that the area of the attachment surface of the die attach section is less than about 11% of the die attach area; and
a bonding support section having a support surface that is adjacent to a location on the second surface of the die that is opposite the location of the bond pad on the first surface of the die, wherein:
the support surface is substantially coplanar with the attachment surface of the die attach section; and
the support surface is not attached to the die.

15. A packaged die as in claim 14, wherein one or more voids are formed in the die attach pad to create a plurality of defined die attach sections, the packaged die further comprising a stress relief section between a pair of defined die attach sections in the die attach pad.

16. A packaged die as in claim 14, wherein the attachment surface of the die attach section has dimples formed thereon.

17. A die attach pad adapted for attachment and support of a die, comprising:
a die attach section having an attachment surface to which an attachment surface of the die is attached, the die attach section positioned so that, when a die is attached to the die attach pad, no part of the attachment surface of the die attach section is adjacent to at least one of the location or locations on the attachment surface of the die that are farthest from the center of the attachment surface of the die, and wherein one or more voids are formed in the die attach pad within a die attach area such that the area of the attachment surface of the die attach section is less than about 11% of the die attach area; and
a bonding support section having a support surface positioned to be adjacent to a location on the attachment surface of the die that is opposite a location at which a bond pad is formed on a surface of the die opposite the attachment surface, wherein the support surface is substantially coplanar with the attachment surface of the die attach section.

18. A die attach pad as in claim 17, wherein, when a die is attached to the die attach pad, no part of the attachment surface of the die attach section is adjacent to a location on the attachment surface of the die that is beyond a distance from the center of the attachment surface of the die that is about 75% of the distance to the location or locations on the attachment surface of the die that are farthest from the center of the attachment surface of the die.

19. A die attach pad as in claim 17, wherein the size of the die attach section is such that, when a die is attached to the die attach pad, no more than about 60% of the area of the attachment surface of the die is attached to the attachment surface of the die attach section.

20. A die attach pad as in claim 17, wherein one or more voids are formed in the die attach pad to create a plurality of defined die attach sections, the number of, or spacing between, die attach sections or rows of die attach sections along a major axis of the die attach pad being greater than the number of, or spacing between, die attach sections or rows of die attach sections along a minor axis of the die attach pad.

21. A die attach pad as in claim 17, wherein one or more voids are formed in the die attach pad to create a plurality of defined die attach sections, the die attach pad further comprising a stress relief section between a pair of defined die attach sections in the die attach pad.

22. A die attach pad as in claim 17, wherein the attachment surface of the die attach section has dimples formed thereon.

* * * * *